(12) United States Patent
Jasinski et al.

(10) Patent No.: US 7,345,287 B2
(45) Date of Patent: Mar. 18, 2008

(54) COOLING MODULE FOR CHARGED PARTICLE BEAM COLUMN ELEMENTS

(75) Inventors: Thomas Jasinski, Muënchen (DE); Dieter Winkler, Muënchen (DE); William A. Eckes, Castro Valley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 334 days.

(21) Appl. No.: 11/240,279

(22) Filed: Sep. 30, 2005

(65) Prior Publication Data

US 2007/0085019 A1    Apr. 19, 2007

(51) Int. Cl.
*H01J 1/50* (2006.01)
*F28D 15/00* (2006.01)

(52) U.S. Cl. .......................... 250/396 ML; 165/104.33
(58) Field of Classification Search ........ 250/396 ML; 165/104.33
See application file for complete search history.

(56) References Cited

U.S. PATENT DOCUMENTS

| | | | |
|---|---|---|---|
| 3,916,201 A | 10/1975 | Herrmann et al. | 250/396 |
| 5,012,104 A | 4/1991 | Young | 250/396 |
| 5,136,166 A | 8/1992 | Young | 250/396 |
| 5,264,706 A | 11/1993 | Oae et al. | 250/492.2 |
| 5,382,800 A | 1/1995 | Nishino et al. | 250/396 |
| 6,053,241 A * | 4/2000 | Kendall | 165/104.33 |

FOREIGN PATENT DOCUMENTS

JP    07073836 A   *  3/1995

* cited by examiner

*Primary Examiner*—Robert Kim
*Assistant Examiner*—Michael Maskell
(74) *Attorney, Agent, or Firm*—Shirley L. Church

(57) ABSTRACT

We have developed a method and apparatus for cooling electromagnetic lens coils of the kind used in charged particle beams. The method and apparatus provide not only a symmetrical cooling effect around the optical axis of the charged particle beam, but also provide improved uniformity of heat transfer. This improved uniformity enables control over the optical axis of the charged particle beam within about 1 nm for high current charged particle beam columns, wherein the current ranges from about 100 nanoamps to about 1000 nanoamps. The use of a squat and wide electromagnetic lens coil in combination with an essentially flat modular cooling panel, which provides uniform cooling to the electromagnetic lens coil, not only enables control over the optical axis of the charged particle beam, but also provides mechanical stability for the charged particle beam column.

21 Claims, 3 Drawing Sheets

COOLING MODULE FOR CHARGED PARTICLE BEAM COLUMN ELEMENTS

FIELD OF THE INVENTION

The present invention relates to a cooling apparatus/module which is useful in cooling charged particle beam column elements, and to a method of using the cooling apparatus.

BRIEF DESCRIPTION OF THE BACKGROUND ART

There is no admission that the background art disclosed in this section constitutes prior art.

In magnetic lenses of the kind employed in various charged particle beam apparatus, and particularly with respect to electron-beam-comprising apparatus, a magnetic flux is created by flowing a current through a coil. This generates heat as a by-product. In the semiconductor industry, for example and not by way of limitation, electron beams are used to direct write a pattern on device structures, to pattern lithographic masks, to monitor the alignment of patterns during device manufacturing, and in inspection tools which evaluate device structure to determine whether a specification is met, for example. Due to the size of semiconductor devices today, there frequently is a requirement that an electron beam landing position be controlled to within one nm. This is very difficult to do with respect to many of the apparatus which make use of an electron beam.

The power dissipated in each magnetic lens is typically in a range between 10 W and 100 W. This leads to temperature changes in materials in the area of the magnetic lenses, especially in pole pieces of an electron beam apparatus, which in turn causes changes in mechanical dimensions due to thermal expansion. These changes in mechanical dimensions frequently lead to instabilities of the charged particle beam, such as an electron beam, especially if the current flowing through the coils is changed during operation of the charged particle beam. To prevent this instability, state-or-the-art electron beam column magnetic lenses are cooled. This cooling is generally done using conductive heat transfer from the magnetic lens coils. The conductive heat transfer is typically achieved using cooling tubes in contact with the magnetic lens coils, where a fluid, typically water, is flowed through the cooling tubes. However, integration of the cooling tubes in a manner which provides for uniform removal of heat from the magnetic lenses is difficult, due to the mechanical complexity of the magnetic lenses. Further, the volume of the magnetic lenses is increased by the addition of cooling tubes. Minimization of the volume is an important aspect in magnetic lens design. Other disadvantages in the use of cooling tubes include the problems related to obtaining good thermal contact between the tubes and the magnetic coils and the possibility of a leak developing in a cooling tube.

U.S. Pat. No. 5,012,104 to Lydia J. Young, issued Apr. 30, 1991, describes what is said to be a thermally stable magnetic deflection assembly for use in an electron or particle beam machine with several separately potted magnetic coils spaced apart and arranged in a particular vertical position on a central pipe. Non metallic, low coefficient of thermal expansion, highly thermally conductive materials are sued throughout and means are provided in an effort to maintain the entire assembly at a desired temperature. (Abstract) FIG. 3 of the patent shows how radial walls of a magnetic wound coil are encased by a potting material. The potted coils are then stacked on a pipe formed of a not-metallic, thermally stable material such as ceramic, which, when positioned in a beam column, surround the central tube. A three piece shroud of non metallic material surrounds the coils to provide a flow path for coolant which is in contact with the exterior of the potting material.

U.S. Pat. No. 5,264,706 to Oae et al., issued Nov. 23, 1993, discloses an electron beam exposure system which includes an electron beam along an optical axis and an evacuated column for accommodating the beam source and extending along the optical axis. Also included are an electron lens for focusing the electron beam and an electromagnetic deflector supplied with a control signal for deflecting the electron beam in response to the control signal. The electromagnetic deflector comprises an inner sleeve surrounding an evacuated column, and first and second mutually separate windings provided on an outer surface of the inner sleeve in an opposed relationship with respect to each other across the optical axis of the electron beam source. An outer sleeve surrounds the inner sleeve with a separation between the sleeves defining a passageway for the flow of coolant. (Abstract) Coolant enters at the bottom of the electron beam column and exits at the top of the column.

U.S. Pat. No. 5,382,800 to Nishino et al., issued Jan. 17, 1995 describes a charged particle beam exposure method for deflecting a charged particle beam in a deflection system which includes electromagnetic deflection coils. The method includes the steps of controlling the deflection system based on deflection data, and generating heat at least in a vicinity of the electromagnetic deflection coils so as to compensate for a change in heat generated from the electromagnetic deflection coils. (Abstract).

U.S. Pat. No. 6,053,241 to Kendall et al., issued Apr. 25, 2000, describes a method of cooling a deflection system for a particle beam, where vibration sensitive devices are contained in the system. The method comprises providing a vibrating cooled heat exchange structure spaced away from the vibration sensitive deflection devices. The technique used is transmission of the heat away from the vibration sensitive devices to the heat exchange structure through a high thermal conductivity structure such as a cold plate. The heat is transmitted from a static heat exchange structure with a static, inert fluid through cold plates to a vibrating heat exchanger cooled by turbulent liquid passing through a coil in the heat exchanger.

The references discussed above show the concern with the effect of heat generation by electromagnetic coils which are used as part of a particle beam system. This concern has increased in recent years as the feature size to be created by or measured by the particle beam has decreased and the error tolerable in positioning of the particle beam optical axis has decreased. For example, current day requirements for an electron beam are that the beam axis position be controlled to a nominal value in the range of about 1 nm. The past requirements for position control were in the range of about 5 nm to about 10 nm. This change in the beam optical axis position control requirement has caused re-evaluation of cooling requirements, in an effort to reduce a drift in the beam optical axis position caused by expansion of apparatus elements in the particle beam column. Our empirical testing has shown that it is possible to meet the 1 nm requirement by improving the method of heat transfer from elements of the particle beam apparatus, and by improving the ability of the cooling device to remove heat from the apparatus elements which affect control over the position of the optical axis of the beam.

DETAILED DESCRIPTION OF THE INVENTION

Figure 1A:
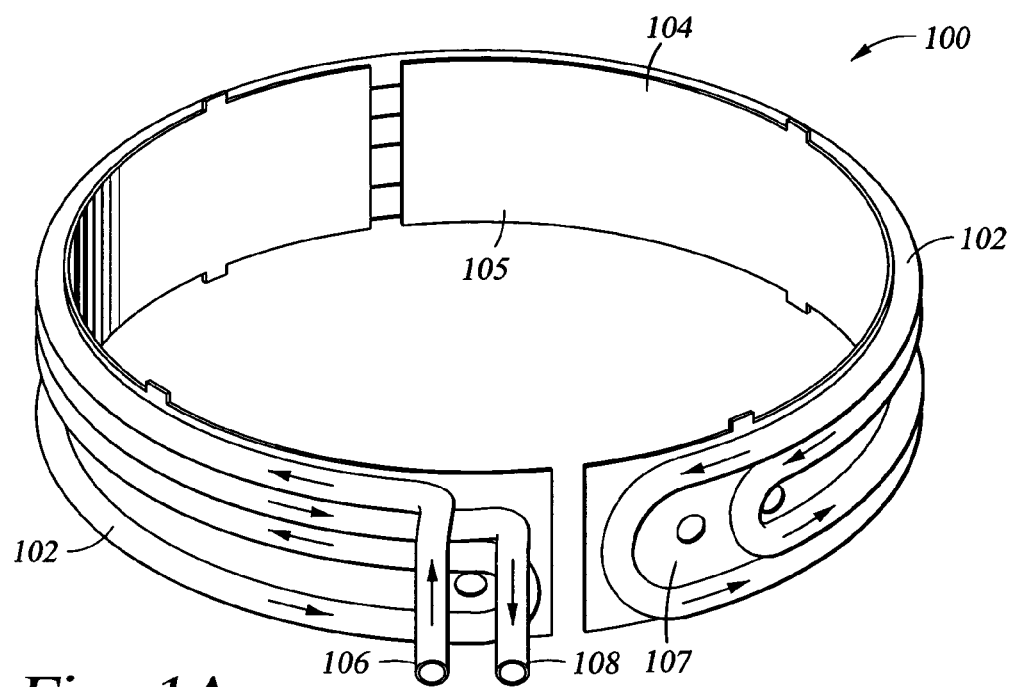
FIG. 1A is an illustration of a prior art cooling jacket of the kind which was placed around the circumference of an electromagnetic lens coil to transfer heat from the lens coil.

As a preface to the detailed description, it should be noted that, as used in this specification and the appended claims, the singular forms "a", "an", and "the" include plural referents, unless the context clearly dictates otherwise.

Use of the term "about" herein indicates that the named variable may vary to ±10%.

We have developed a method and apparatus for cooling electromagnetic lens coils of the kind used in charged particle beams, as well as other elements of the kind used to fabricate charged particle beam columns. The method and apparatus provide not only a symmetrical cooling effect around the optical axis of the charged particle beam, but also provide improved uniformity of heat transfer. This improved uniformity enables control over the landing position of the charged particle beam within about 1 nm for high current charged particle beam columns, wherein the current ranges from about 100 nanoamps to about 1000 nanoamps.

High current charged particle beams typically make use of electromagnetic lens coils which are squat and wide rather than tall and thin. The squat and wide lens coils enable a shorter path length for the charged particle beam. In the case of an electron beam, for example, electron-electron interactions are reduced when the path of the charged particle beam is shorter, as a result there is less blur in the electron beam produced at the surface of a substrate contacted by the beam. In addition, the shorter, wider charged particle beam column provides improved mechanical stability. The squat and wide lens coils are typically in the shape of a disk with an opening through the center, where the optical axis of the beam passes through the opening in the disk. The ratio of the radius of the disk to the height of the disk typically ranges from about 3:1 to about 15:1, more typically from about 5:1 to about 10:1. The coils have wire windings, where the wire is wrapped in a horizontal direction around the axis of the disk, in a manner similar to the way thread is wrapped on a bobbin of a sewing machine. Since the wire is lying relatively flat at the base surface and top surface of the disk, these surfaces are relatively flat.

To obtain a more uniform heat transfer from the surface of the wire wrapped lens coil/disk, we have designed a flat modular cooling panel which contacts the flat radial surfaces (the base surface and the top surface) of the electromagnetic lens coil/disk. For example the radial surfaces of the wrapped lens coil/disk typically exhibit a surface roughness ranging from about 0.2 µm RMS to about 5.0 µm RMS, by way of example and not by way of limitation. The flat modular cooling panel also typically exhibits a surface roughness ranging from about 0.2 µm RMS to about µm RMS, by way of example and not by way of limitation. The flat modular cooling panel is typically designed to be symmetrical with respect to the optical axis of the charged particle beam. In many instances, the flat modular cooling panel is also a flat disk with an opening through the center, where the optical axis of the charged particle beam passes through the opening in the center of the modular cooling panel. However, the modular cooling panel need not be a continuous, flat disk, but may be a series of flat rectangles arranged radially around the optical axis of the charged particle beam, or may be some other configuration which is generally symmetrical with respect to the optical axis of the charged particle beam. One of skill in the art will be able to envision various flat modular panels which can be used. The larger the number of modular cooling panels, the larger the number of inlets and outlets required to service the cooling panels with cooling fluid. Thus, the design of the cooling panels is limited by this requirement. The modular cooling panels may be used to cool other elements of the charged particle beam column, such as pole pieces, by way of example and not by way of limitation.

By using the squat electromagnetic lens coils in combination with the flat, modular cooling panels which comprise internal conduits for cooling fluid circulation, the maximum distance from any wire in the wire wrapped lens coils to the cooling surface is the height of the lens coil/disk. In the instance where the ratio of the radius to the height of the lens coil/disk ranges from about 5:1 to about 10:1, for example and not by way of limitation, the distance from the wrapped wire to the cooling surface is typically reduced by a minimum of about 0.5 to about 0.1, respectively, of the distance for previously known heat transfer systems, where the electromagnetic lens coil was cooled by heat exchange at the exterior circumference surface of the lens coil alone.

We have developed an apparatus used to obtain increased uniformity in heat transfer within a charged particle beam column. The apparatus includes at least one electromagnetic lens coil, where the ratio of a radius to height of said electromagnetic lens coil ranges from about 3:1 to about 15:1, used in combination with at least one essentially flat modular heat transfer panel containing buried fluid flow conduits. At least one heat transfer panel major surface is in contact with at least one major surface of the electromagnetic lens coil. A major surface refers to one of the larger surfaces present on the electromagnetic lens coil or the modular heat transfer panel.

The apparatus may be used to carry out a method of obtaining increased uniformity in heat transfer within a charged particle beam column. The method comprises providing at least one electromagnetic lens coil, wherein the ratio of a radius to height of said electromagnetic lens coil ranges from about 3:1 to about 15:1; and contacting a major surface of said electromagnetic lens coil with an essentially flat surface of a modular heat transfer panel containing buried fluid flow conduits, whereby uniformity of heat transfer across a major surface of the electromagnetic lens coil typically becomes uniform within at least ±1%, and more typically within ±0.1%.

As discussed above, there is a need for improved apparatus and an improved method to remove heat which is generated by the operation of electromagnetic lens coils of the kind used in charged particle beams. The method and apparatus need to provide not only a symmetrical cooling effect around the optical axis of the charged particle beam, but also provide improved uniformity of heat transfer. High current (in the range of about 100 nanoamps to about 1,000 nanoamps) charged particle beams typically make use of electromagnetic lens coils which are squat and wide rather than tall and thin. The squat and wide lens coils enable a shorter path length for the charged particle beam. The present invention is not intended to be limited to applications where a high current charged particle beam is used, and the invention is useful for low (in the range of 100 pA, for example) beam current applications as well. However, the embodiments of the invention illustrated below are with respect to a high current charged particle beam, such as an electron beam of the kind typically used in the creation of photomasks. The electromagnetic lens coils used for such applications are typically squat and wide, with an opening through the center of the coil, where the optical axis of the beam passes through the opening in the center of the coil. The ratio of the radius of the coil to the height of the coil typically ranges from about 3:1 to about 15:1, more typically from about 5:1 to about 10:1.

Figure 1B:
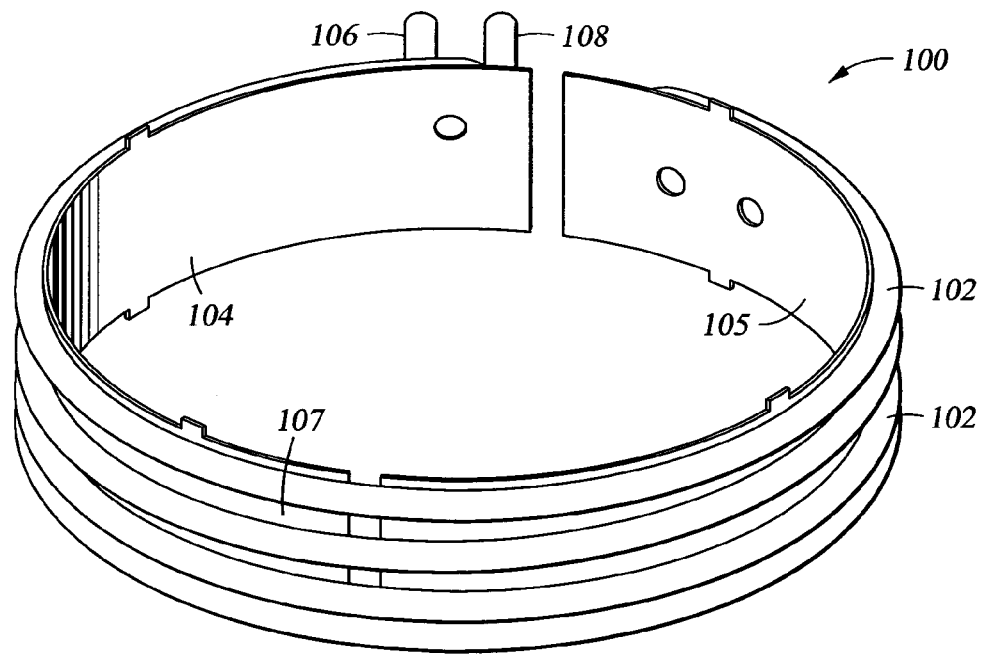
FIG. 1B shows another view of the prior art cooling jacket shown in FIG. 1A.

FIGS. 1A and 1B show a comparative prior art design for a cooling jacket 100 which is placed around the exterior circumference of an electromagnetic lens coil. The cooling jacket 100 includes a heat transfer surface 104, the interior surface 105 of which is placed in contact with the exterior surface of an electromagnetic lens coil (not shown). Braced to the exterior surface 107 of heat transfer surface 104 is tubing 102 which acts as a conduit for the flow of a fluid which is used to cool heat transfer surface 104. The heat transfer fluid (not shown) enters cooling jacket at tubing entry 106 and exits at tubing exit 108. Because the tubing 102 through which the heat transfer fluid travels is round on the exterior and is brazed to a curved surface 107 of cooling jacket 100, there are inefficiencies in the conductive heat transfer of heat from cooling jacket 100 interior surface 105 through the tubing walls of tubing 102 and into the heat transfer fluid. Not only are there inefficiencies in heat transfer within the cooling jacket 100 itself, there are also non-uniformities in heat transfer since the more central area of the electromagnetic lens coil (not shown) is more distant from cooling jacket 100 than the circumferential area of the electromagnetic lens coil. The circumferential area of the electromagnetic lens coil is cold relative to the internal, more central area of the magnetic lens coil. This difference in temperature across a magnetic coil, from center to circumference, for example, causes elements of a charged particle beam column (not shown)to move, and this affects the charged particle beam position. As discussed above, the charged particle beam position may drift as much as 5 nm to 10 nm due to non-uniformity of temperature in the electromagnetic lens coils themselves and non-uniformity of temperature in charged particle beam elements adjacent the electromagnetic lens coils. This becomes more apparent with reference to FIG. 2 which shows a portion 200 of an electron beam column which includes electromagnetic lens coils 202 and their location with respect to a charged particle beam optical axis 204, pole pieces 208 and 210 of the electron beam column, and other elements present in the electron beam column.

Figure 2:
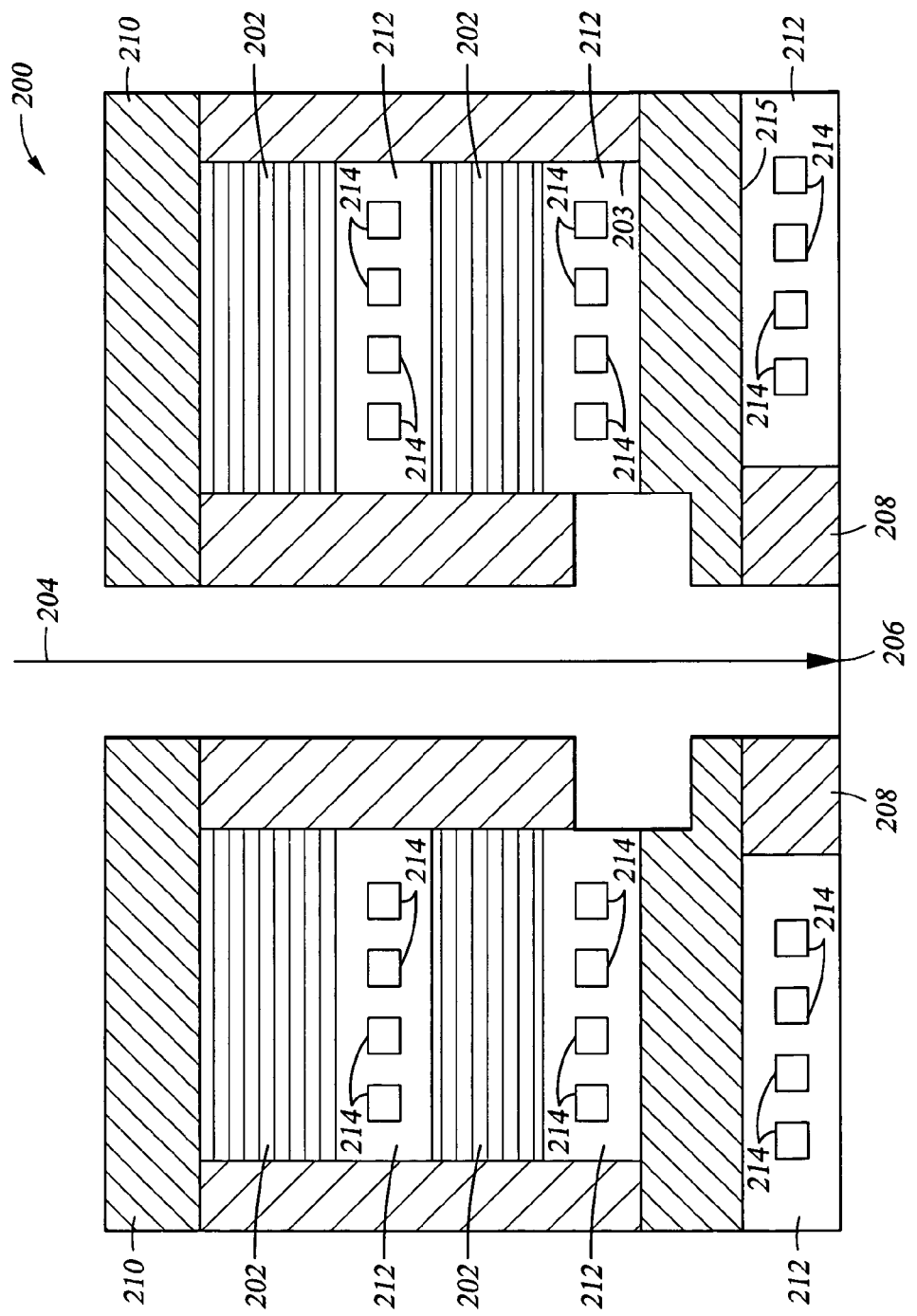
FIG. 2 shows a portion of an electron beam column which makes use of flat modular cooling modules to cool both electromagnetic lens coils as well as a bottom plate of the electron beam column.

FIG. 2 shows a portion 200 of an electron beam column which makes use of flat modular cooling modules 212 with internal, buried conduits 214 to cool both electromagnetic lens coils 202 as well as pole pieces 208 and 210 of the electron beam column, by way of example and not by way of limitation. The flat modular cooling modules 212 are generally located symmetrically with respect to optical axis 204 of the electron beam column, with the beam exiting at aperture 206. A series of electromagnetic lens coils 202 are located in various positions with respect to electron beam optical axis 204. The large masses of superstructure and functional elements are affected by the heat generated by operation of the electromagnetic lens coils. These adjacent masses of material are expanded as heat is applied, and reduced in size as heat is removed. When changes are made in the amount of current applied to a given lens coil, this changes the expansion or contraction of the material mass in the area of that lens coil. As a result, despite the fact that the magnetic lens coils 202 are symmetrically placed relative to the electron beam optical axis 204, there may be a drift in the optical axis of the electron beam. This problem is magnified if the cooling applied to an electromagnetic lens coil/disk 202 is not uniform across the radius of the lens coil/disk 202.

Looking back at FIGS. 1A and 1B, it becomes clear that the heat transfer from center to outer edge of an electromagnetic lens coil/disk 202 will not be uniform across the radius of the lens coil/disk 202 if a cooling jacket 100 is applied around the outer circumference 203 of a lens coil/disk 202. Further, the efficiency of heat transfer from the lens coil/disk 202 is greatly reduced when only the outer edge of the lens coil/disk 101 is contacted by a heat transfer cooling surface.

To improve both the efficiency of heat transfer away from the electromagnetic lens coil/disk 202 and to improve the uniformity of heat transfer, we developed flat, modular cooling plates 212 for use in combination with electromagnetic lens coil/disk 202, as well as for use in combination with other elements of the electron beam column which require cooling, if desired. For example a modular cooling plate 212 is used at the base 215 of the electron beam column so that heat is not transferred to a substrate (not shown) upon which the electron beam is operating. This substrate is present beneath the beam exit aperture 206.

Figure 3A:
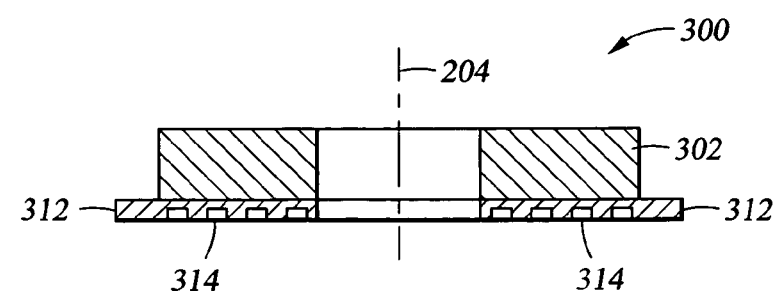
FIG. 3A shows a schematic side view of an electromagnetic lens coil overlying a modular cooling panel.
Figure 3B:
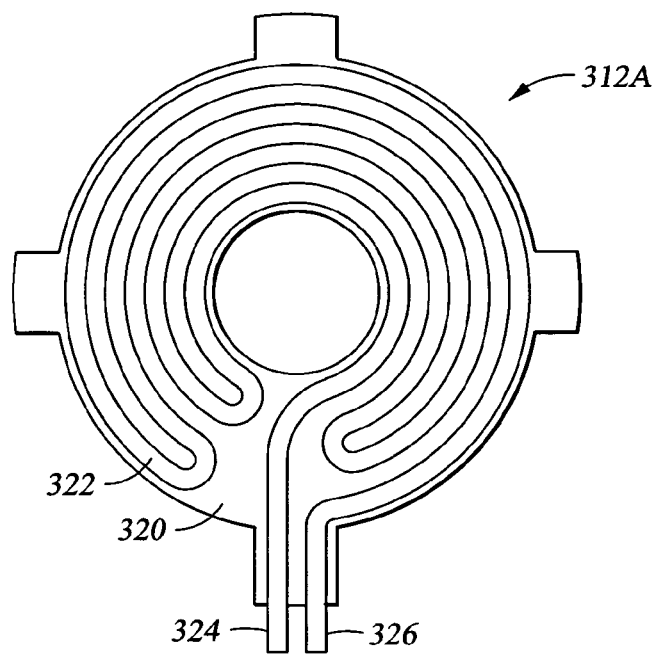
FIG. 3B shows a top view of one embodiment of a modular cooling panel of the kind shown in FIG. 3A. In this embodiment, there is a single cooling circuit.

The modular cooling plates 212 include buried heat transfer fluid channels 214 through which a cooling fluid (not shown) flows. FIG. 3A shows a schematic side view of an electromagnetic lens coil 302 overlying a modular cooling panel 312 which contains buried fluid flow channels 314 through which a cooling fluid (not shown) flows. FIG. 3B shows a top view of one embodiment of a flat modular cooling panel 312A, where, beneath the upper surface 320 of cooling panel 312A is a buried fluid flow channel 322, having a fluid flow entry 324 and a fluid flow exit 326.

Figure 3C:
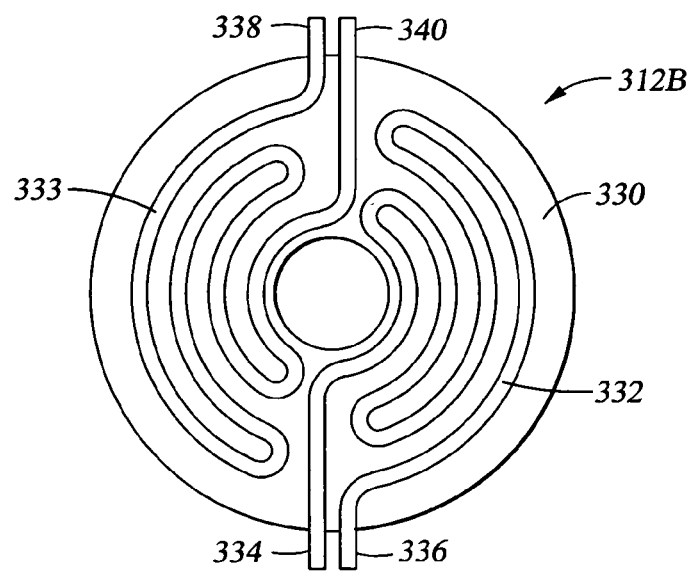
FIG. 3C shows a top view of another embodiment of a modular cooling panel of the kind shown in FIG. 3A. In this embodiment, there are two cooling circuits.

FIG. 3C shows a top view of another embodiment of a modular cooling panel 312B, where, beneath the upper surface 330 of cooling panel 312A are a pair of buried fluid flow channels 332 and 333, which permit a more radially symmetrical flow of incoming and outgoing cooling fluid (not shown). The radially symmetrical positioning of the two flows has the effect that a temperature gradient due to water temperature change along the conduits is itself radially symmetric. This leads to radially symmetrical expansion of an adjacent particle beam column element, This expansion is much less damaging than that caused by side-to-side gradients. Fluid flow channel 332 includes an entry 334 and an exit 336, while fluid flow channel 333 includes an entry 340 and an exit 338 circuit. Radially symmetric temperature gradients are less likely to result in a pole piece motion that will lead to a particle beam motion.

The flat modular cooling (or heating) panel has the following advantages over a cooling jacket which makes use of tubing in contact with a heat transfer surface. In addition a modular cooling panel having a flat surface on each side may be buried within a magnetic lens coil to provide improved cooling (or heating). This halves the maximum distance of coil wire-to cooling panel surface. The cooling module may consist of one building block only, so that it is easy to mechanically integrate it into a system. The flat surface on the cooling panel allows for good thermal contact with an element of the charged particle beam column which is also relatively flat. Many of the elements in a charged particle beam are designed to be squat and relatively flat to shorten the beam path (distance of travel of the beam), and these make good thermal contact with flat modular cooling panel. The internal, buried fluid flow channels in the modular cooling panel reduce the volume which is required for the cooling panel to a minimum, also shortening the beam path. The diameter, form and arrangement of the buried cooling channels within a module can be arranged to achieve maximum efficiency or special coolant circuits, without affecting the design of the particle beam column.

The flat modular cooling panel can be integrated into a magnetic lens coil above or below the coil, or between two magnetic lens coils which are electrically connected. There is a possibility of using several modular cooling panels in contact with several magnetic lens coils which are electrically connected. In some embodiments, mechanical drifts in a charged particle beam optical axis due to remaining temperature changes can be reduced by designing the heat transfer module in a symmetric fashion, typically in a fourfold symmetry.

The buried channels in a modular cooling panel may be arranged in such a way that the ingoing water flow runs parallel to the outgoing water flow, thus minimizing temperature differences due to the temperature rise of the coolant between input and output. Further improvement is possible by using several coolant circuits within one cooling module. Parts of an electromagnetic lens which are not directly accessible to a modular cooling panel in a given design, may be connected to a cooling module by a thermal bridge, such as a solid copper part. This solid copper part may be an extension of the modular cooling panel itself. As previously mentioned, a modular cooling panel (or heating panel) may be used adjacent to areas of material mass or functional elements within a charged particle beam column in order to regulate the temperature of such mass of element even when the mass or element is distant from the electromagnetic lens. An excellent example is the use of a modular cooling panel at the base of the charged particle beam column, to avoid heating of a substrate which is adjacent the column during processing using the charged particle beam. Another example is the use of a modular cooling panel adjacent to a pole piece of a charged particle beam column.

As mentioned previously, it is an advantage for the radial surfaces of the wrapped lens coil/disk when the surface roughness is reduced. A surface roughness in the range of about 0.2 µm RMS to about 5 µm RMS provides adequate contact for good heat transfer at the surface. The flat modular cooling panel also typically exhibits a surface roughness ranging from about 0.2 µm RMS to about 5.0 µm RMS, by way of example and not by way of limitation. The modular cooling panel need not be a disk to provide for symmetrical cooling. A plurality of modular cooling panels may be distributed in a manner in the charged particle beam column which permits symmetrical cooling within the column. One of skill in the art will be able to envision various combinations of flat modular panels which can be used. The larger the number of modular cooling panels, the larger the number of inlets and outlets required to service the cooling panels with cooling fluid. Thus, the design of the cooling panels is limited by this requirement.

The use of squat electromagnetic lens coils, in combination with the flat, modular cooling panels which comprise internal conduits for cooling fluid circulation, provides a synergistic effect in terms of uniform heat transfer within a charged particle beam column. This synergistic effect reduces charged particle beam drift as well as blur at the edges of the beam. For high current charged particle beam applications, it is recommended that the ratio of the radius to the height of a lens coil/disk range from about 3:1 to about 15:1, and more typically from about 5:1 to about 10:1.

While the invention has been described in detail above with reference to particular schematics and drawings, various modifications within the scope and spirit of the invention will be apparent to those of working skill in this technological field. One skilled in the art, upon reading applicants'disclosure, can make use of various designs of modular cooling panels in combination with various designs of magnetic lens coils to take advantage of the invention disclosed. Accordingly, the scope of the invention should be measured by the appended claims.

We claim:

1. An apparatus used to obtain increased uniformity in heat transfer within a charged particle beam column, said apparatus comprising:
   at least one electromagnetic lens coil, wherein the ratio of a radius to height of said electromagnetic lens coil ranges from about 3:1 to about 15:1; and
   at least one essentially flat modular heat transfer panel containing buried fluid flow conduits, wherein said heat transfer panel is in contact with said electromagnetic lens coil at a major, radial surface of said electromagnetic lens coil.

2. An apparatus in accordance with claim 1, wherein said heat transfer panel is a cooling panel relative to said electromagnetic lens coil.

3. An apparatus in accordance with claim 1 or claim 2, wherein said charged particle beam is a high current charged particle beam, where the current is within a range of about 100 nanoamps to about 1000 nanoamps.

4. An apparatus in accordance with claim 3, wherein said charged particle beam is an electron beam.

5. A apparatus in accordance with claim 1 or claim 2, wherein a power dissipated in said magnetic lens coil ranges from about 10 W and about 100 W.

6. An apparatus in accordance with claim 4, wherein a power dissipated in said electromagnetic lens coil ranges between about 10 W and about 100 W.

7. An apparatus in accordance with claim 1 or claim 2, wherein said ratio of said electromagnetic lens coil radius to said height of said electromagnetic lens coil ranges from about 5:1 to about 10:1.

8. An apparatus in accordance with claim 1 or claim 2, wherein said electromagnetic lens coil is wrapped with wire in a circumferential direction around a circle formed by a radius of a major surface of said electromagnetic lens coil.

9. An apparatus in accordance with claim 1 or claim 2, wherein a heat transfer surface of said electromagnetic lens coil which is in contact with a surface of said essentially flat modular heat transfer panel has a surface roughness ranging from about 0.2 µm RMS to about 5 µm RMS.

10. An apparatus in accordance with claim 1 or claim 2, wherein a heat transfer surface of said essentially flat modular heat transfer panel which is in contact with said electromagnetic lens coil has a surface roughness ranging from about 0.2 µm RMS to about 5 µm RMS.

11. An apparatus in accordance with claim 1 or claim 2, wherein said essentially flat modular heat transfer panel is integrated into a magnetic lens coil.

12. An apparatus in accordance with claim 11, wherein said essentially flat modular heat transfer panel is present between two magnetic lens coil sections, where the coil sections are electrically connected with each other.

13. An apparatus in accordance with claim 1 or claim 2, wherein said buried fluid flow conduits are designed so that fluid flow of incoming fluid runs parallel to fluid flow of outgoing fluid, whereby temperature differences due to temperature rise of said fluid between said an input for said fluid and an exit of said fluid from said essentially flat modular heat transfer panel are reduced.

14. An apparatus in accordance with claim 1 or claim 2, wherein at least one essentially flat modular heat transfer panel containing buried fluid flow conduits is also used to cool an element of said particle beam column other than an electromagnetic coil.

15. An apparatus in accordance with claim 14, wherein said element other than an electromagnetic coil is a pole piece of said particle beam column.

16. A method of obtaining increased uniformity in heat transfer within a charged particle beam column, said method comprising:
providing at least one electromagnetic lens coil, wherein the ratio of a radius to height of said electromagnetic lens coil ranges from about 3:1 to about 15:1; and
contacting a major radial surface of said electromagnetic lens coil with an essentially flat surface of a modular heat transfer panel containing buried fluid flow conduits, whereby uniformity of heat transfer across said major surface of said electromagnetic lens coil becomes uniform within ±1%.

17. A method in accordance with claim 16, wherein said wherein said heat transfer panel provides cooling at the contact surface with said electromagnetic lens coil.

18. A method in accordance with claim 16 or claim 17, wherein the electromagnetic lens coil is present within an electron beam column.

19. A method in accordance with claim 16 or claim 17, wherein said heat transfer panel removes heat dissipated in said magnetic lens coil which ranges from about 10 W to about 100 W.

20. An method in accordance with claim 16 or claim 17, wherein said essentially flat modular heat transfer panel is integrated into a magnetic lens coil, whereby heat transfer becomes more efficient.

21. An method in accordance with claim 16 or claim 17, wherein said buried fluid flow conduits are such that fluid flow of incoming fluid runs parallel to fluid flow of outgoing fluid, whereby temperature differences due to temperature rise of said fluid between said an input for said fluid and an exit of said fluid from said essentially flat modular heat transfer panel are reduced.

\* \* \* \* \*

UNITED STATES PATENT AND TRADEMARK OFFICE
CERTIFICATE OF CORRECTION

PATENT NO. : 7,345,287 B2
APPLICATION NO. : 11/240279
DATED : March 18, 2008
INVENTOR(S) : Thomas Jasinski, Dieter Winkler and William A. Eckes It is certified that error appears in the above-identified patent and that said Letters Patent is hereby corrected as shown below:

In the Specification

Column 6, lines 47 – 62, should read:
 "Figure 3C shows a top view of another embodiment of a modular cooling panel 312B, where, beneath the upper surface 330 of cooling panel 312B are a pair of buried fluid flow channels 332 and 333, which permit a more radially symmetrical flow of incoming and outgoing cooling fluid (not shown). The radially symmetrical positioning of the two flows has the effect that a temperature gradient due to water temperature change along the conduits is itself radially symmetric. This leads to radially symmetrical expansion of an adjacent particle beam column element. This expansion is much less damaging than that caused by side-to-side gradients. Fluid flow channel 332 includes an entry 334 and an exit 336, while fluid flow channel 333 includes an entry 340 and an exit 338 circuit. Radially symmetric temperature gradients are less likely to result in a pole piece motion that will lead to a particle beam motion."

In the Claims

Column 8, line 43 – 45, Claim 5 should read:
 "An apparatus in accordance with claim 1 or claim 2, wherein a power dissipated in said electromagnetic lens coil ranges from about 10 W and about 100 W."

Column 9, lines 1 – 3, Claim 11 should read:
 "An apparatus in accordance with claim 1 or claim 2, wherein said essentially flat modular heat transfer panel is integrated into a electromagnetic lens coil."

Column 9, lines 4 – 7, Claim 12 should read:
 "An apparatus in accordance with claim 11, wherein said essentially flat modular heat transfer panel is present between two electromagnetic lens coil sections, where the coil sections are electrically connected with each other."

Signed and Sealed this
Twenty-second Day of October, 2013

Teresa Stanek Rea
*Deputy Director of the United States Patent and Trademark Office*

CERTIFICATE OF CORRECTION (continued)
U.S. Pat. No. 7,345,287 B2

Column 10, lines 13 – 16, Claim 19 should read:
 "A method in accordance with claim 16 or claim 17, wherein said heat transfer panel removes heat dissipated in said electromagnetic lens coil which ranges from about 10 W to about 100 W."

Column 10, lines 17 – 20, Claim 20 should read:
 "A method in accordance with claim 16 or claim 17, wherein said essentially flat modular heat transfer panel is integrated into a electromagnetic lens coil, whereby heat transfer becomes more efficient."

Column 10, lines 21 – 27, Claim 21 should read:
 "A method in accordance with claim 16 or claim 17, wherein said buried fluid flow conduits are such that fluid flow of incoming fluid runs parallel to fluid flow of outgoing fluid, whereby temperature differences due to temperature rise of said fluid between said an input for said fluid and an exit of said fluid from said essentially flat modular heat transfer panel are reduced."